United States Patent
Chen (10) Patent No.: US 10,026,692 B2
(45) Date of Patent: Jul. 17, 2018

(54) SEMICONDUCTOR STRUCTURE HAVING ETCHING STOP LAYER AND MANUFACTURING METHOD OF THE SAME

(71) Applicant: MACRONIX INTERNATIONAL CO., LTD., Hsinchu (TW)

(72) Inventor: Shih-Hung Chen, Hsinchu County (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 15/096,315

(22) Filed: Apr. 12, 2016

(65) Prior Publication Data

US 2017/0294384 A1   Oct. 12, 2017

(51) Int. Cl.
| | |
|---|---|
| H01L 23/528 | (2006.01) |
| H01L 27/11556 | (2017.01) |
| H01L 27/11582 | (2017.01) |
| H01L 23/522 | (2006.01) |
| H01L 21/768 | (2006.01) |

(52) U.S. Cl.
CPC .... *H01L 23/5283* (2013.01); *H01L 21/76838* (2013.01); *H01L 21/76841* (2013.01); *H01L 21/76877* (2013.01); *H01L 23/5226* (2013.01); *H01L 27/11556* (2013.01); *H01L 27/11582* (2013.01)

(58) Field of Classification Search
None
See application file for complete search history.

(56) References Cited

U.S. PATENT DOCUMENTS

| | | | |
|---|---|---|---|
| 8,664,761 B1 * | 3/2014 | Hu | H01L 27/11519 257/698 |
| 9,406,609 B1 * | 8/2016 | Lung | H01L 21/76816 |
| 2015/0262871 A1 * | 9/2015 | Lee | H01L 21/76816 257/774 |
| 2016/0020169 A1 * | 1/2016 | Matsuda | H01L 23/528 257/758 |
| 2016/0240428 A1 * | 8/2016 | Tung | H01L 21/7682 |

* cited by examiner

*Primary Examiner* — Reema Patel
*Assistant Examiner* — Steven Christopher
(74) *Attorney, Agent, or Firm* — McClure, Qualey & Rodack, LLP (57) ABSTRACT

A semiconductor structure and a manufacturing method of the same are provided. The semiconductor structure includes a stack structure, an etching stop layer, and a conductive structure. The stack structure includes a plurality of conductive layers and a plurality of insulating layers stacked interlacedly. The etching stop layer is formed on a sidewall of the stack structure. An energy gap of the etching stop layer is larger than 6 eV. The conductive structure is electrically connected to at least one of the conductive layers.

18 Claims, 13 Drawing Sheets

SEMICONDUCTOR STRUCTURE HAVING ETCHING STOP LAYER AND MANUFACTURING METHOD OF THE SAME

BACKGROUND

Technical Field

The present disclosure relates in general to a semiconductor structure and a manufacturing method thereof, and particularly to a 3D semiconductor structure and a manufacturing method thereof.

Description of the Related Art

In recent years, the structures of semiconductor devices have been changed constantly, and the storage capacity of the devices has been increased continuously. Memory devices are used in storage elements for many products such as MP3 players, digital cameras, computer files, etc. As the application increases, the demand for the memory device focuses on small size and large memory capacity. For satisfying the requirement, a memory device having a high element density and a small size and the manufacturing method thereof are in need.

As the element density increases, the semiconductor devices have more stacked planes accordingly, and thus the difficulty of manufacturing the conductive contact structures increases, thereby influencing the stability of the as-formed structures. As such, it is desirable to develop a three-dimensional (3D) memory device with larger number of multiple stacked planes to achieve greater storage capacity, improved qualities, and yet remaining a small size.

SUMMARY

The present disclosure relates in general to a semiconductor structure and a manufacturing method thereof. In the semiconductor structure of the embodiments, the energy gap of the etching stop layer is larger than 6 eV, such that the electric filed can be lowered, and the tunneling length of the etching stop layer can be increased, thereby the difficulty of the electrons penetrating through the etching stop layer is increased, the tunneling current can be reduced, and different conductive layers can be more effectively electrically isolated from one another.

According to an embodiment of the disclosure, a semiconductor structure is provided. The semiconductor structure includes a stack structure, an etching stop layer, and a conductive structure. The stack structure includes a plurality of conductive layers and a plurality of insulating layers stacked interlacedly. The etching stop layer is formed on a sidewall of the stack structure. An energy gap of the etching stop layer is larger than 6 eV. The conductive structure is electrically connected to at least one of the conductive layers.

According to another embodiment of the disclosure, a manufacturing method of a semiconductor structure is provided. The manufacturing method of the semiconductor structure includes the following steps: forming a stack structure, which includes forming a plurality of conductive layers and forming a plurality of insulating layers, wherein the conductive layers and the insulating layers are stacked interlacedly; forming an etching stop layer on a sidewall of the stack structure, wherein an energy gap of the etching stop layer is larger than 6 eV; and forming a conductive structure electrically connected to at least one of the conductive layers.

The above and other aspects of the disclosure will become better understood with regard to the following detailed description of the non-limiting embodiment(s). The following description is made with reference to the accompanying drawings.

BRIEF DESCRIPTION OF THE DRAWINGS

FIGS. 9A-11B illustrate a process for manufacturing a semiconductor structure according to an embodiment of the present disclosure.

DETAILED DESCRIPTION

In the embodiments of the present disclosure, a semiconductor structure and a method of manufacturing the same are provided. In the semiconductor structure of the embodiments, the energy gap of the etching stop layer is larger than 6 eV, such that the electric filed can be lowered, and the tunneling length of the etching stop layer can be increased, thereby the difficulty of the electrons penetrating through the etching stop layer is increased, the tunneling current can be reduced, and different conductive layers can be more effectively electrically isolated from one another. The following embodiments are for the purpose of elaboration only, not for limiting the scope of protection of the invention. Besides, some of the secondary elements are omitted in the drawings accompanying the following embodiments to highlight the technical features of the invention.

Figure 1A:
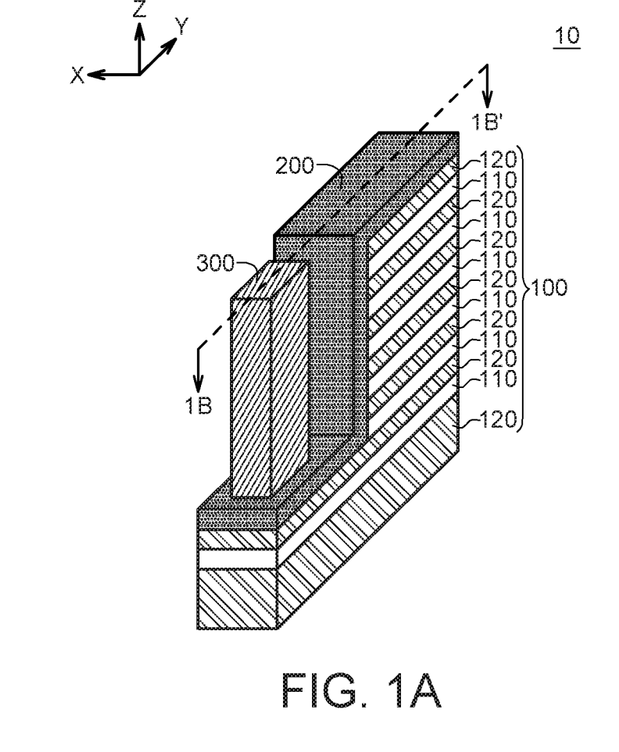
FIG. 1A shows a schematic view of a semiconductor structure according to an embodiment of the present disclosure.
Figure 1B:
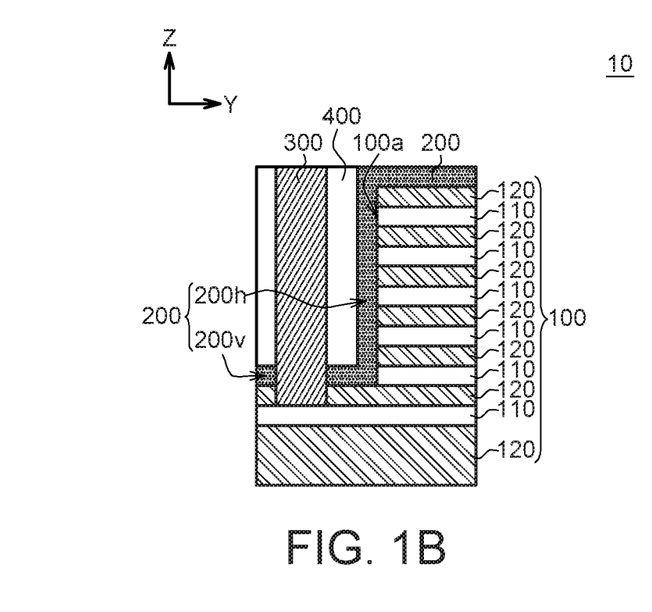
FIG. 1B is a cross-sectional view along the cross-sectional line 1B-1B' in FIG. 1A.

FIG. 1A shows a schematic view of a semiconductor structure according to an embodiment of the present disclosure, and FIG. 1B is a cross-sectional view along the cross-sectional line 1B-1B' in FIG. 1A. As shown in FIGS. 1A-1B, the semiconductor structure includes a stack structure 100, an etching stop layer 200, and a conductive structure 300. The stack structure 100 includes a plurality of conductive layers 110 and a plurality of insulating layers 120, and the conductive layers 110 and the insulating layers 120 are stacked interlacedly. The etching stop layer 200 is formed on a sidewall 100a of the stack structure 100. An energy gap of the etching stop layer 200 is larger than 6 eV. The conductive structure 300 is electrically connected to at least one of the conductive layers 110.

In the embodiment, the energy gap of the etching stop layer 200 is larger than 6 eV, such that the electric filed can be lowered, and the tunneling length of the etching stop layer 200 can be increased, thereby the difficulty of the electrons penetrating through the etching stop layer 200 is increased, the tunneling current can be reduced, and different conductive layers 110 can be more effectively electrically isolated from one another.

In the embodiment, the material of the etching stop layer 200 may include aluminum oxide ($Al_xO_y$, e.g. $Al_2O_3$), magnesium oxide (MgO), silicon zirconium oxide ($Zr_xSi_yO_z$, e.g. $ZrSiO_4$), silicon hafnium oxide ($Hf_xSi_yO_z$, e.g. $HfSiO_4$), or combinations thereof.

As shown in FIGS. 1A-1B, in the embodiment, the etching stop layer 200 is located between the conductive structure 300 and the sidewall 100a of the stack structure 100.

As shown in FIGS. 1A-1B, in the embodiment, the etching stop layer 200 has a vertical segment 200v and a horizontal segment 200h connected to each other. The vertical segment 200v is located on the sidewall 100a, and the conductive structure 300 penetrates through the horizontal segment 200h to be electrically connected to the at least one of the conductive layers 110.

As shown in FIG. 1B, the semiconductor structure 100 further include a dielectric layer 400 (not shown in FIG. 1A). The dielectric layer 400 is formed on the etching stop layer 200. In the embodiment, the dielectric layer 400 is such as a silicon nitride layer.

Figure 2:
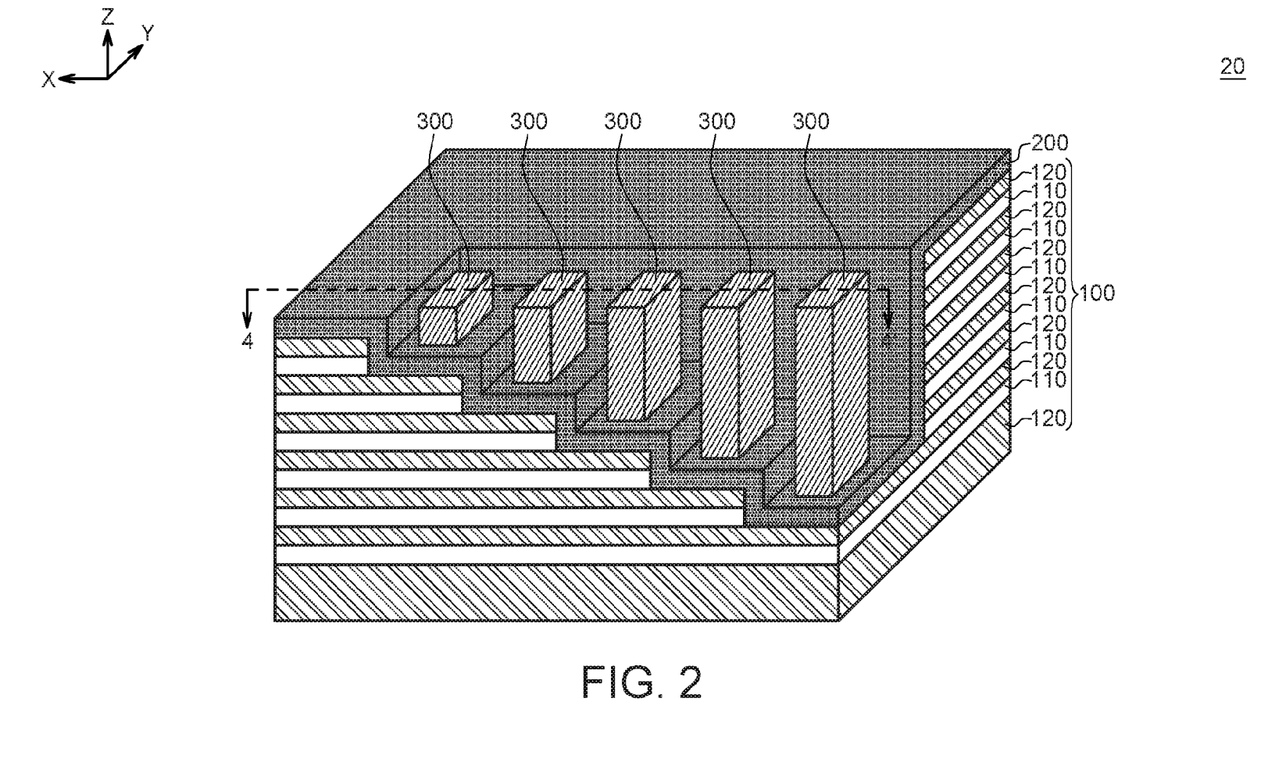
FIG. 2 shows a schematic view of a semiconductor structure according to another embodiment of the present disclosure.

FIG. 2 shows a schematic view of a semiconductor structure according to another embodiment of the present disclosure. The elements in the present embodiment sharing similar or the same labels with those in the previous embodiment are similar or the same elements, and the description of which is omitted. The semiconductor structure 20 as shown in FIG. 2 may be used in such as a 3D vertical channel NAND memory device.

As shown in FIG. 2, the semiconductor structure 20 may include a plurality of the conductive structures 300, and each of the conductive structures 300 is respectively electrically connected to each of the conductive layers 110.

Figure 3A:
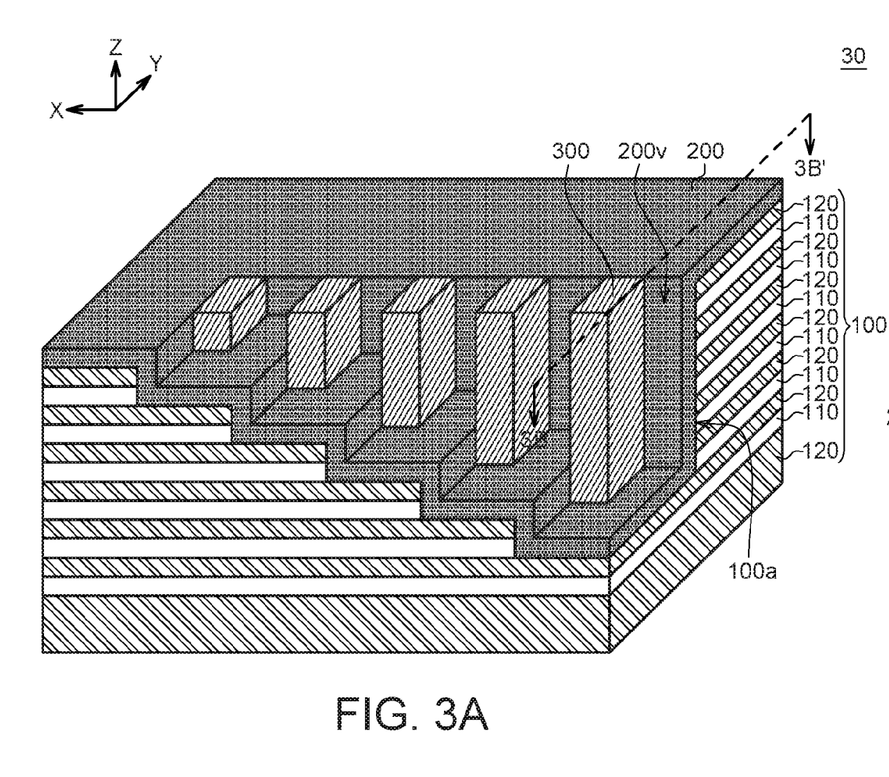
FIG. 3A shows a schematic view of a semiconductor structure according to a further embodiment of the present disclosure.
Figure 3B:
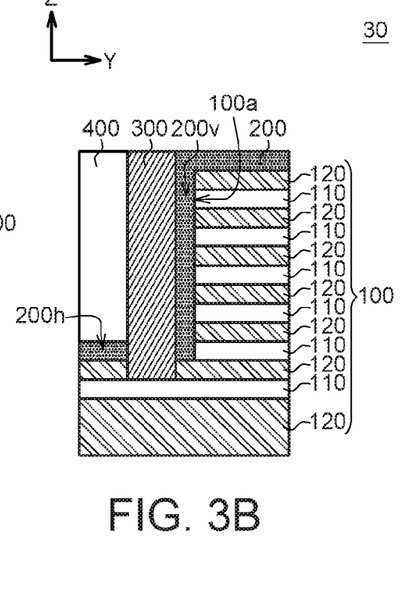
FIG. 3B is a cross-sectional view along the cross-sectional line 3B-3B' in FIG. 3A.

FIG. 3A shows a schematic view of a semiconductor structure according to a further embodiment of the present disclosure, and FIG. 3B is a cross-sectional view along the cross-sectional line 3B-3B' in FIG. 3A. The elements in the present embodiment sharing similar or the same labels with those in the previous embodiment are similar or the same elements, and the description of which is omitted. The semiconductor structure 30 as shown in FIGS. 3A-3B may be used in such as a 3D vertical channel NAND memory device.

As shown in FIGS. 3A-3B, in the conductive structure 300, the conductive structure 300 may be adjacent to the vertical segment 200v of the etching stop layer 200. In the embodiment, the conductive structure 300 being adjacent to the vertical segment 200v of the etching stop layer 200 may be due to the alignment shift in the manufacturing process, such that the conductive structure 300 and the conductive layers 100 are only separated by the thickness of an etching stop layer 200.

In the embodiment, even for the semiconductor structure 30 as shown in FIGS. 3A-3B, the energy gap of the etching stop layer 200 is larger than 6 eV, compared to the commonly used material used for etching stop layers, such as SiN having an energy gap of 4.7-5 eV, which has a higher energy gap and a longer tunneling length, due to that the energy gap of the etching stop layer 200 is larger than 6 eV, the difficulty of the electrons penetrating through the etching stop layer 200 is increased, the tunneling current can be reduced, and different conductive layers 110 can be more effectively electrically isolated from one another.

Figure 4A:
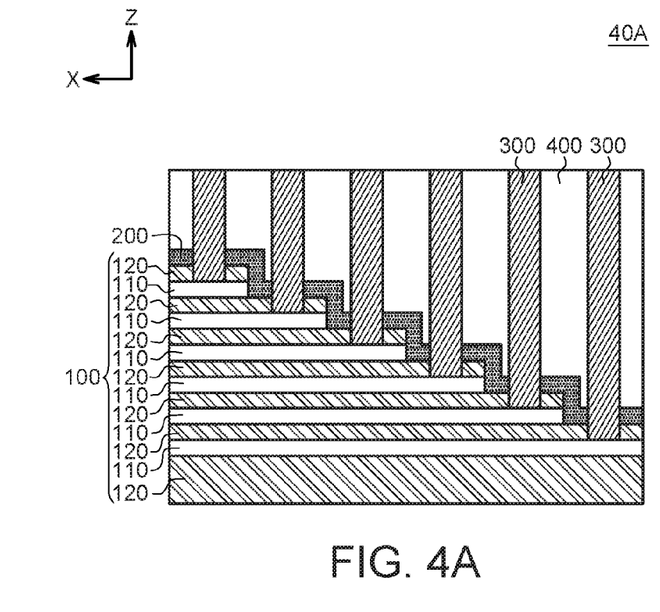
FIGS. 4A-4B show cross-sectional views of semiconductor structures according to some embodiments of the present disclosure.
Figure 4B:
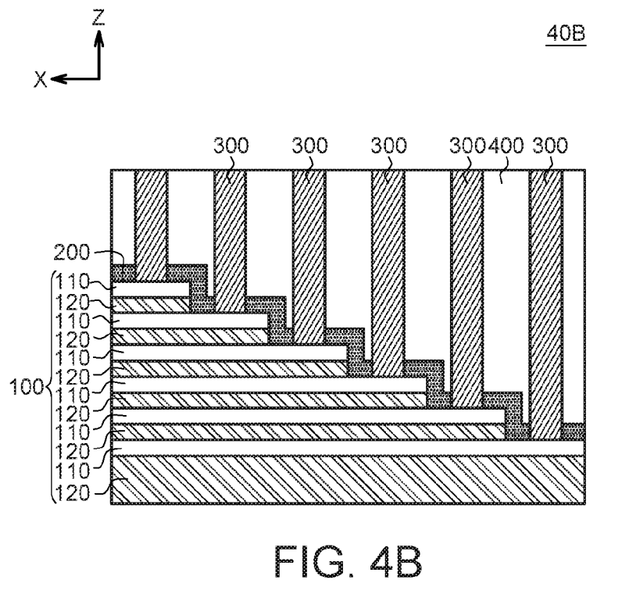

FIGS. 4A-4B show cross-sectional views of semiconductor structures according to some embodiments of the present disclosure. The elements in the present embodiment sharing similar or the same labels with those in the previous embodiment are similar or the same elements, and the description of which is omitted.

The semiconductor structure 40A as shown in FIG. 4A is represented as a cross-sectional view along an X-Z plane. The semiconductor structure 40A can be regarded as a modified embodiment of the semiconductor structure 20 as shown in FIG. 2 and represented as the cross-sectional view along the cross-sectional line 4-4'.

As shown in FIG. 4A, each of the conductive structures 300 is respectively electrically connected to each of the conductive layers 110. Moreover, in the embodiment as shown in FIG. 4A, the etching stop layer 200 is formed on the surfaces of the insulating layers 120, and the conductive structures 300 penetrate through the etching stop layer 200 and the insulating layers 120 to be electrically connected to the corresponding conductive layers 110.

The semiconductor structure 40B as shown in FIG. 4B is represented as a cross-sectional view along an X-Z plane. The semiconductor structure 40B can be regarded as a modified embodiment of the semiconductor structure 40A as shown in FIG. 4A. In the embodiment as shown in FIG. 4B, the etching stop layer 200 is formed on the surfaces of the conductive layers 110, and the conductive structures 300 penetrate through the etching stop layer 200 to be electrically connected to the corresponding conductive layers 110.

Figure 5:
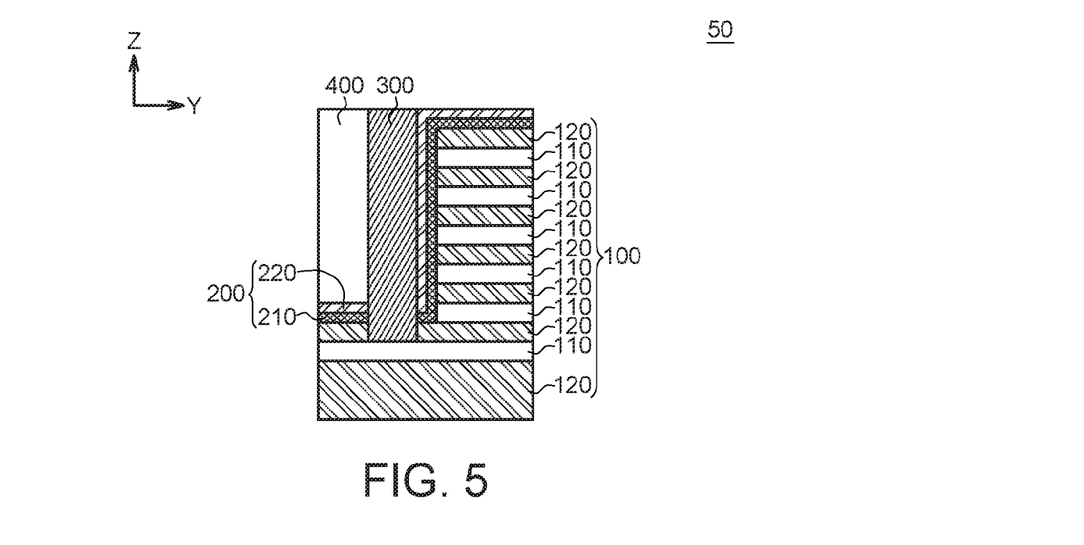
FIG. 5 shows a cross-sectional view of a semiconductor structures according to an additional embodiment of the present disclosure.

FIG. 5 shows a cross-sectional view of a semiconductor structures according to an additional embodiment of the present disclosure. The elements in the present embodiment sharing similar or the same labels with those in the previous embodiment are similar or the same elements, and the description of which is omitted.

The semiconductor structure 50 as shown in FIG. 5 is represented as a cross-sectional view along a Y-Z plane. As shown in FIG. 5, in the semiconductor structure 50, the etching stop layer 200 may include a first stop layer 210 and a second stop layer 220. The second stop layer 220 is formed on the first stop layer. The first stop layer 210 is formed on the sidewall 100a of the stack structure 100, and an energy gap of the first stop layer 210 is larger than 6 eV.

In the embodiment, the energy gap of the first stop layer 210 is such as larger than the energy gap of the second stop layer 220.

As shown in FIG. 5, the first stop layer 210 is formed between the second stop layer 220 and the sidewall 100a of the stack structure 100. In the embodiment, the first stop layer 210 is substantially conformal with the second stop layer 220.

As shown in FIG. 5, in one embodiment, the conductive structure 300 may be adjacent to the second stop layer 220. In other embodiments, the conductive structure 300 and the second stop layer 220 may be separated by the dielectric layer 400 (not shown in drawings).

In the embodiment, a material of the first stop layer 210 may include silicon oxide ($SiO_2$), aluminum oxide ($Al_xO_y$, e.g. Al$_2$O$_3$), magnesium oxide (MgO), silicon zirconium oxide (Zr$_x$Si$_y$O$_z$, e.g. ZrSiO$_4$), silicon hafnium oxide (Hf$_x$Si$_y$O$_z$, e.g. HfSiO$_4$), or combinations thereof, a material of the second stop layer 220 may include silicon nitride (SiN), aluminum oxide, magnesium oxide, silicon zirconium oxide, silicon hafnium oxide, or combinations thereof, and the first stop layer 210 is different from the second stop layer 220.

Figure 6:
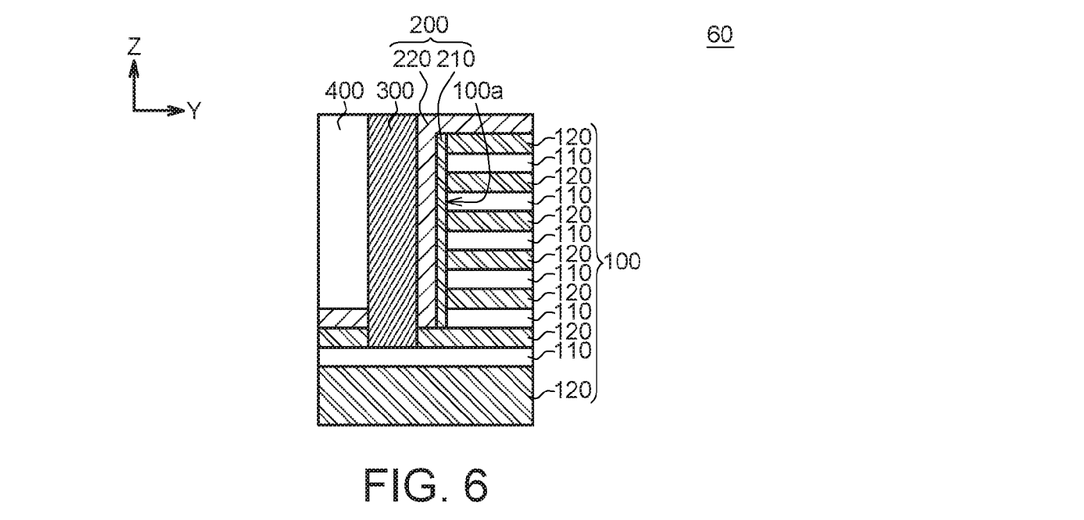
FIG. 6 shows a cross-sectional view of a semiconductor structures according to another additional embodiment of the present disclosure.

FIG. 6 shows a cross-sectional view of a semiconductor structures according to another additional embodiment of the present disclosure. The elements in the present embodiment sharing similar or the same labels with those in the previous embodiment are similar or the same elements, and the description of which is omitted.

The semiconductor structure 60 as shown in FIG. 6 is represented as a cross-sectional view along a Y-Z plane. As shown in FIG. 6, in the embodiment, the first stop layer 210 is formed only between the second stop layer 220 and the sidewall 100a of the stack structure 100. The conductive structure 300 penetrates through only the second stop layer 220 to be electrically connected to the corresponding conductive layer 110.

Figure 7A:
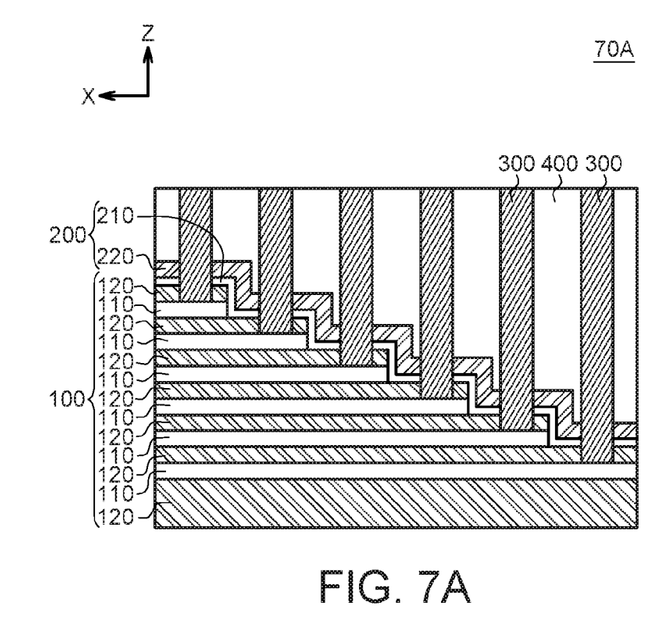
FIGS. 7A-7B show cross-sectional views of semiconductor structures according to some other embodiments of the present disclosure.
Figure 7B:
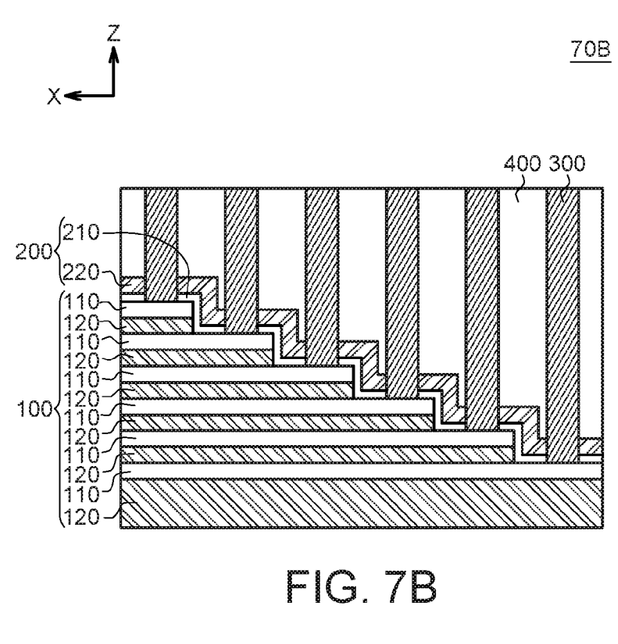

FIGS. 7A-7B show cross-sectional views of semiconductor structures according to some other embodiments of the present disclosure. The elements in the present embodiment sharing similar or the same labels with those in the previous embodiment are similar or the same elements, and the description of which is omitted. The semiconductor structures 70A-70B as shown in FIGS. 7A-7B are represented as cross-sectional views along an X-Z plane.

In the embodiment as shown in FIG. 7A, the first stop layer 210 is formed on the surfaces of the insulating layers 120, and the second stop layer 220 is formed on the first stop layer 210. The conductive structure 300 penetrates through the first stop layer 210, the second stop layer 220, and the insulating layer 120 to be electrically connected to the corresponding conductive layer 110.

In the embodiment as shown in FIG. 7B, the first stop layer 210 is formed on the surfaces of the conductive layers 110, and the second stop layer 220 is formed on the first stop layer 210. The conductive structure 300 penetrates through the first stop layer 210 and the second stop layer 220 to be electrically connected to the corresponding conductive layer 110.

FIGS. 8A-8D show curves of applied voltages vs. thicknesses of various etching stop layers according to some embodiments of the present disclosure. In the embodiments as shown in FIGS. 8A-8D, the applied voltage is 13V, and the total thickness of the etching stop layer is 120 Å. The elements in the present embodiment sharing similar or the same labels with those in the previous embodiment are similar or the same elements, and the description of which is omitted.

Figure 8A:
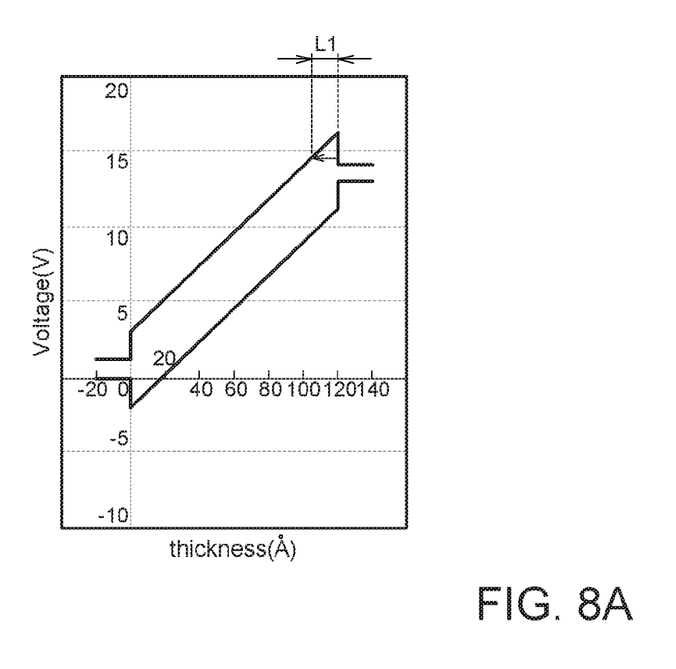
FIGS. 8A-8D show curves of applied voltages vs. thicknesses of various etching stop layers according to some embodiments of the present disclosure.
Figure 8B:
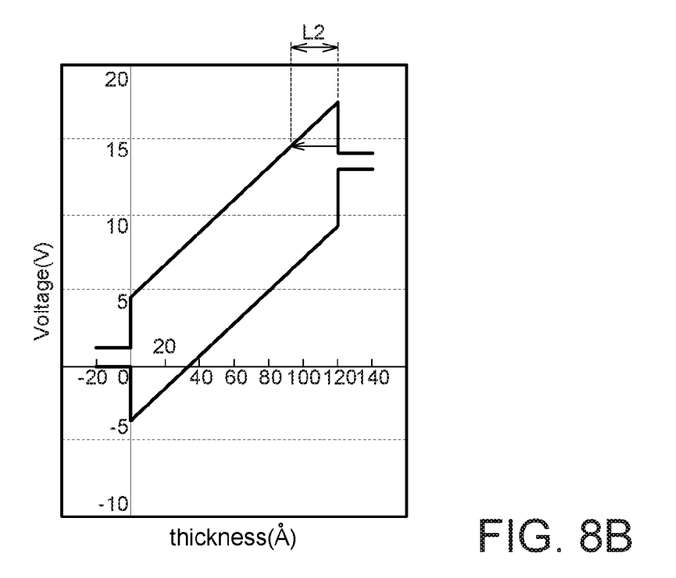

FIG. 8A shows a curve of applied voltages vs. the thickness of a single-layer silicon nitride etching stop layer 200, wherein the silicon nitride layer has a tunneling length L1, and FIG. 8B shows a curve of applied voltages vs. the thickness of a single-layer aluminum oxide etching stop layer 200, wherein the aluminum oxide layer has a tunneling length L2. It is apparent that the tunneling length L2 is larger than the tunneling length L1.

According to the embodiments of the present disclosure, since the energy gap of aluminum oxide is larger than 6 eV, and the energy gap of silicon nitride is about 4.7-5 eV, the etching stop layer 200 having an energy gap of larger than 6 eV can provide a relatively large tunneling length, such that different conductive layers 110 are less easily to be electrically connected to each other via electron tunneling through the etching stop layer 200, and hence occurrence of short circuit between different conductive layers 110 is less; accordingly, damage to the operation performance of the semiconductor device can be avoided, and thus the stability of the semiconductor device can be increased.

Figure 8C:
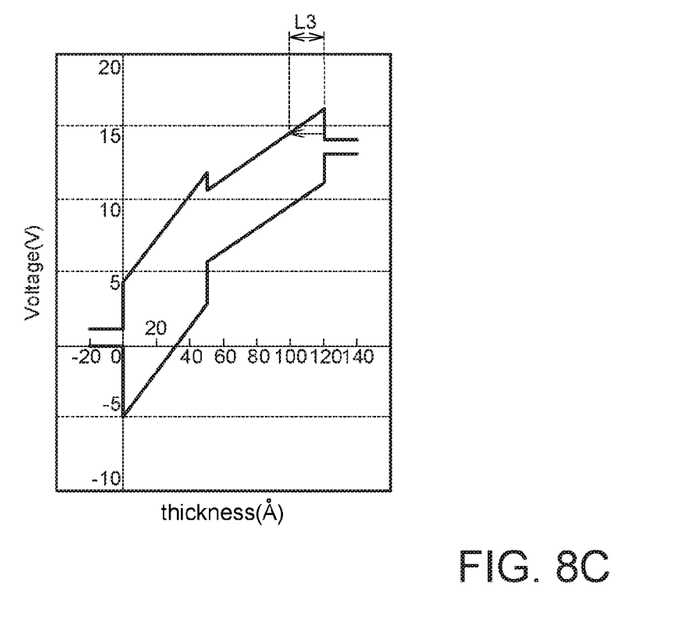

FIG. 8C shows a curve of applied voltages vs. the thickness of an etching stop layer 200 applying silicon oxide as the first stop layer 210 and silicon nitride as the second stop layer 220, wherein the composite layer of silicon oxide-silicon nitride has a tunneling length L3. It is apparent that the tunneling length L3 is larger than the tunneling length L1 as shown in FIG. 8A.

According to the embodiments of the present disclosure, since the energy gap of silicon oxide of the first stop layer 210 is larger than 6 eV, despite that the second stop layer 220 is silicon nitride, the overall etching stop layer 200 can still provide a relatively large tunneling length, such that different conductive layers 110 are less easily to be electrically connected to each other via electron tunneling through the etching stop layer 200, and hence occurrence of short circuit between different conductive layers 110 is less; accordingly, the stability of the semiconductor device can be increased.

Figure 8D:
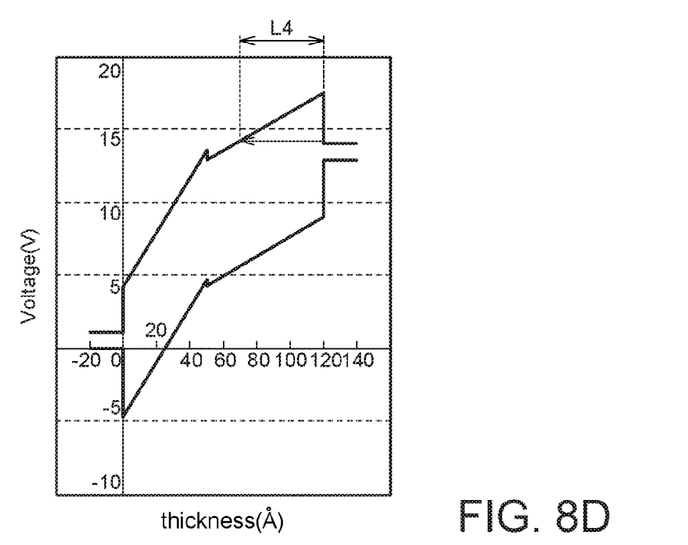

FIG. 8D shows a curve of applied voltages vs. the thickness of an etching stop layer 200 applying silicon oxide as the first stop layer 210 and aluminum oxide as the second stop layer 220, wherein the composite layer of silicon oxide-aluminum oxide has a tunneling length L4. It is apparent that the tunneling length L4 is larger than the tunneling length L1 as shown in FIG. 8A.

According to the embodiments of the present disclosure, since the energy gap of silicon oxide of the first stop layer 210 is larger than 6 eV, and the energy gap of aluminum oxide of the second stop layer 220 is larger than 6 eV, the overall etching stop layer 200 can further provide a relatively large tunneling length, such that different conductive layers 110 are less easily to be electrically connected to each other via electron tunneling through the etching stop layer 200, and hence occurrence of short circuit between different conductive layers 110 is less; accordingly, the stability of the semiconductor device can be increased.

FIGS. 9A-11B illustrate a process for manufacturing a semiconductor structure according to an embodiment of the present disclosure. FIGS. 9A, 10A, and 11A and FIGS. 9B, 10B, and 11B respectively illustrate the processes for manufacturing the semiconductor structures as shown in FIG. 4A and FIG. 4B. The elements in the present embodiment sharing similar or the same labels with those in the previous embodiment are similar or the same elements, and the description of which is omitted.

Figure 9A:
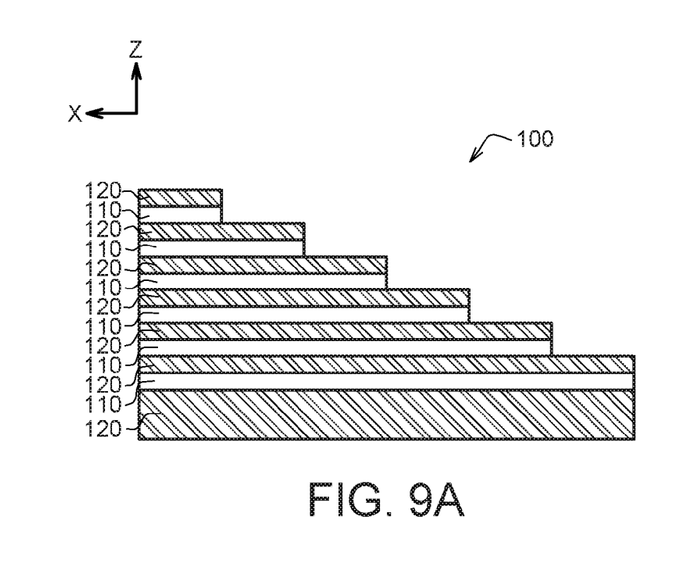
Figure 9B:
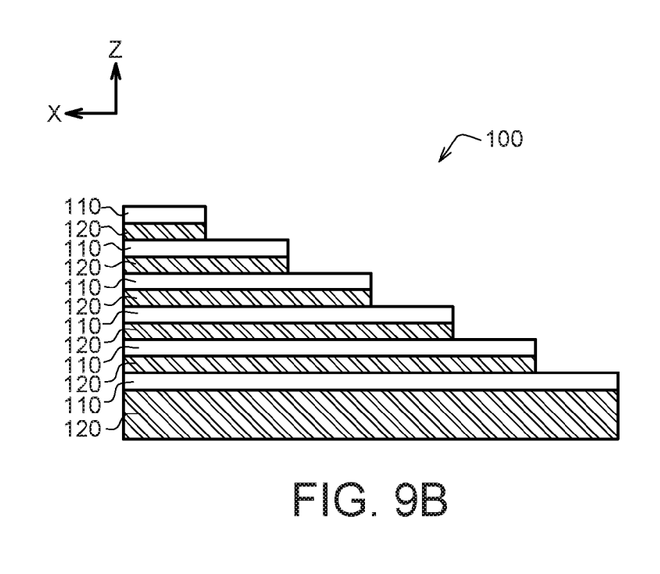

As shown in FIGS. 9A and 9B, the stack structure 100 is formed. The present step includes forming a plurality of conductive layers 110 and forming a plurality of insulating layers 120, and the conductive layers 110 and the insulating layers 120 are stacked interlacedly. As shown in FIGS. 9A and 9B, the stack structure 100 has a staircase structure with the insulating layers 120 and the conductive layers 110 as the surfaces of the staircase.

Figure 10A:
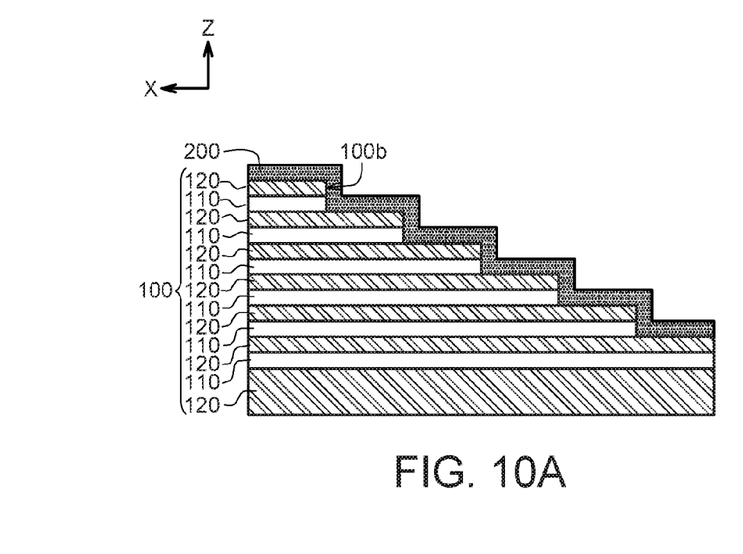
Figure 10B:
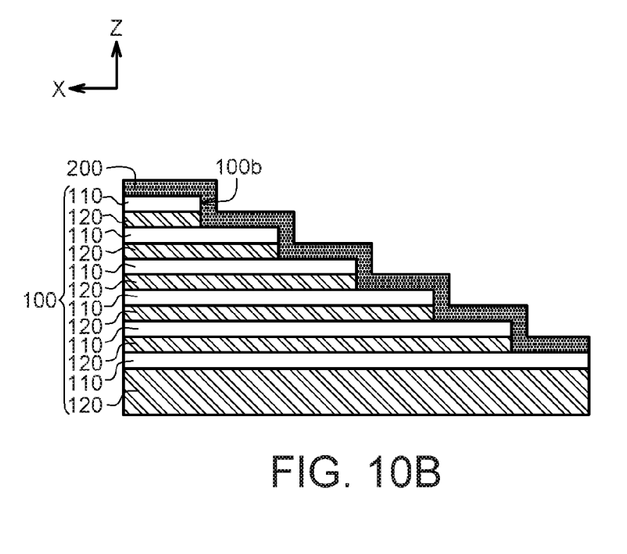

As shown in FIGS. 10A and 10B, the etching stop layer 200 is formed on the stack structure 100. For example, as shown in FIGS. 1A-1B, the etching stop layer 200 is formed on a sidewall 100a of the stack structure 100, and the etching stop layer 200 is made of a material having an energy gap of larger than 6 eV. As shown in FIGS. 10A and 10B, the etching stop layer 200 is formed on the surfaces of the insulating layers 120 and the surfaces of the conductive layers 110, and the etching stop layer 200 is formed on a side surface 100b of the staircase of the stack structure 100.

Figure 11A:
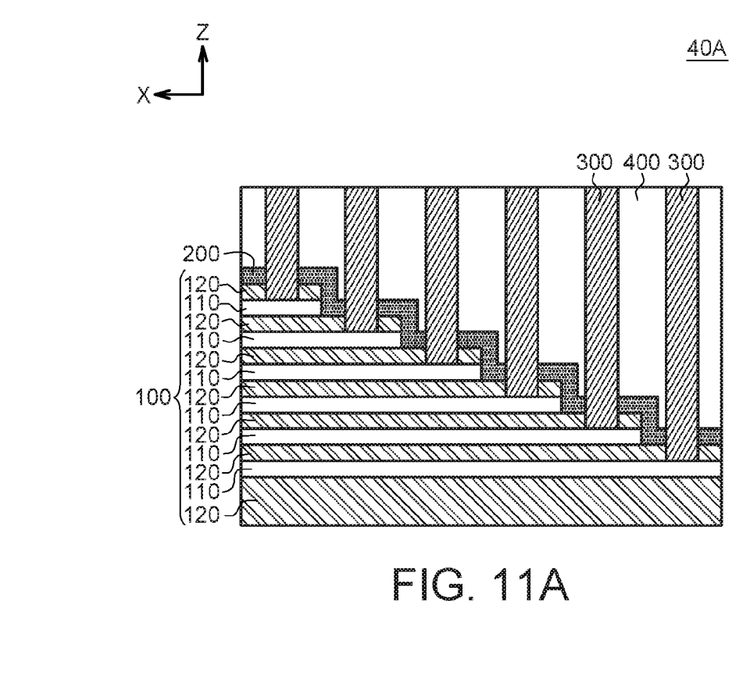
Figure 11B:
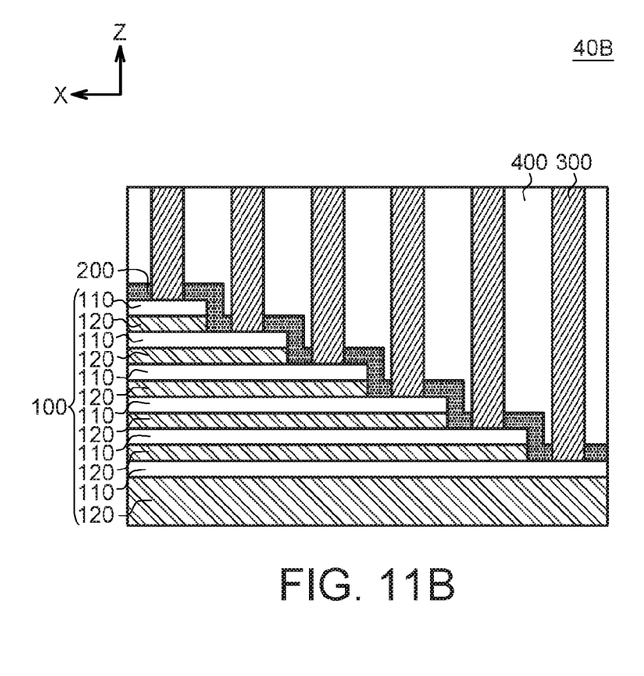

Next, as shown in FIGS. 11A and 11B, the conductive structure 300 is formed, and the dielectric layer 400 is formed on the etching stop layer 200. One conductive structure 300 is electrically connected to at least one of the conductive layers 110. As shown in FIGS. 11A and 11B, each of the conductive structures 300 is respectively electrically connected to each of the corresponding conductive layers 110. As such, the semiconductor structures 40A and 40B as shown in FIGS. 4A and 4B are formed.

The manufacturing methods of the semiconductor structures as shown in FIGS. 1A-1B, 2, and 3A-3B are similar to those afore-mentioned, and the differences are mainly in the amount of the conductive structures 300 and whether the conductive structure 300 and the vertical segment 200v of the etching stop layer 200 is connected or not.

The manufacturing method of the semiconductor structure as shown in FIG. 5 is similar to those afore-mentioned, and the difference is mainly in that the step of forming the etching stop layer 200 is divided into two separate steps of forming the first stop layer 210 and forming the second stop layer 220.

Figure 12A:
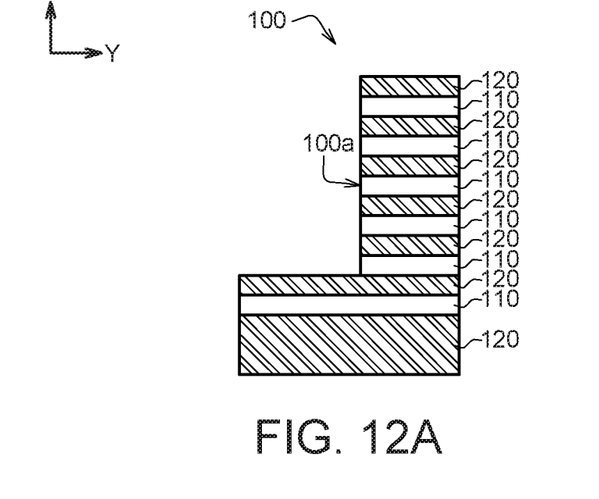
FIGS. 12A-12C illustrate a process for manufacturing a semiconductor structure according to another embodiment of the present disclosure.
Figure 12B:
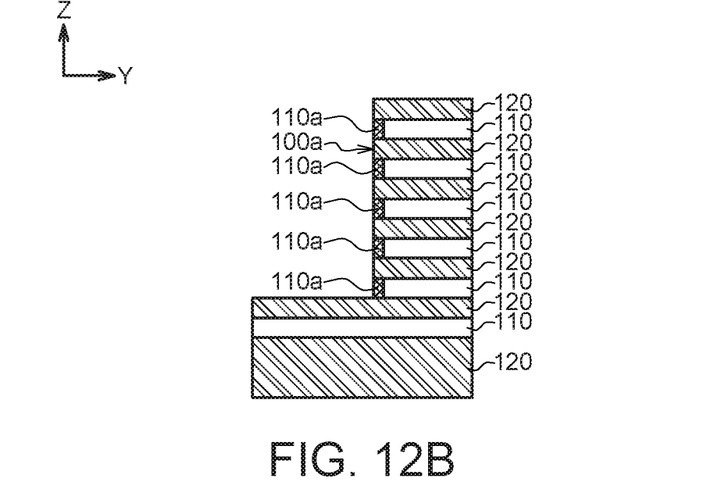
Figure 12C:
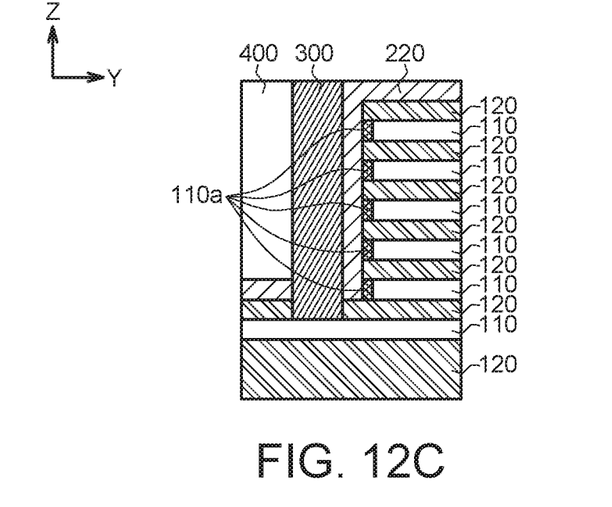

FIGS. 12A-12C illustrate a process for manufacturing a semiconductor structure according to another embodiment of the present disclosure. The elements in the present embodiment sharing similar or the same labels with those in the previous embodiment are similar or the same elements, and the description of which is omitted.

As shown in FIG. 12A, the stack structure 100 is formed. The present step includes forming a plurality of conductive layers 110 and forming a plurality of insulating layers 120, and the conductive layers 110 and the insulating layers 120 are stacked interlacedly. The stack structure 100 has a sidewall 100a.

As shown in FIG. 12B, an oxidation process is performed on the conductive layers 110 from the sidewall 100a direction for forming a plurality of oxide layers 110a along the sidewall 100a. The oxide layers 110a connected to portions of the insulating layers 120 adjacent to the oxide layer 110a, and the oxide layers 110a together with the portions of the insulating layers 120 connected thereto substantially form the first stop layer of the etching stop layer.

As shown in FIG. 12C, the second stop layer 220 is formed on the sidewall 100a of the stack structure 100, the conductive structure 300 is formed, and the dielectric layer 400 is formed. The second stop layer 220 is formed on the sidewall 100a of the stack structure and directly contacts the first stop layer formed from the portions of the insulating layers 120 and the oxide layers 110a. As such, the semiconductor structure 60 as shown in FIG. 6 (FIG. 12C) is formed.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor structure, comprising:
   a stack structure, comprising:
   a plurality of conductive layers; and
   a plurality of insulating layers, wherein the conductive layers and the insulating layers are stacked interlacedly;
   an etching stop layer formed on a sidewall of the stack structure, wherein an energy gap of the etching stop layer is larger than 6 eV, and a material of the etching stop layer comprises aluminum oxide, magnesium oxide, silicon zirconium oxide, silicon hafnium oxide, or combinations thereof; and
   a plurality of conductive structures, wherein at least one conductive structure of the plurality of conductive structures is electrically connected to at least one of the conductive layers, the etching stop layer has a vertical segment and a horizontal segment connected to each other, the vertical segment is located on the sidewall of the stack structure, and the at least one conductive structure is in direct contact with the vertical segment of the etching stop layer.

2. The semiconductor structure according to claim 1, wherein the etching stop layer is located between the at least one conductive structure and the sidewall.

3. The semiconductor structure according to claim 1, wherein each of the conductive structures is respectively electrically connected to each of the conductive layers.

4. The semiconductor structure according to claim 1, wherein the at least one conductive structure penetrates through the horizontal segment to be electrically connected to the at least one of the conductive layers.

5. The semiconductor structure according to claim 1, wherein the etching stop layer comprises:
   a first stop layer formed on the sidewall of the stack structure, wherein an energy gap of the first stop layer is larger than 6 eV; and
   a second stop layer formed on the first stop layer.

6. The semiconductor structure according to claim 5, wherein the first stop layer is formed between the second stop layer and the sidewall of the stack structure.

7. The semiconductor structure according to claim 5, wherein the at least one conductive structure is adjacent to the second stop layer.

8. The semiconductor structure according to claim 5, wherein a material of the first stop layer comprises silicon oxide, aluminum oxide, magnesium oxide, silicon zirconium oxide, silicon hafnium oxide, or combinations thereof, a material of the second stop layer comprises silicon nitride, aluminum oxide, magnesium oxide, silicon zirconium oxide, silicon hafnium oxide, or combinations thereof, and the first stop layer is different from the second stop layer.

9. The semiconductor structure according to claim 1, further comprising:
   a dielectric layer formed on the etching stop layer.

10. A manufacturing method of a semiconductor structure, comprising:
    forming a stack structure, comprising:
    forming a plurality of conductive layers; and
    forming a plurality of insulating layers, wherein the conductive layers and the insulating layers are stacked interlacedly;
    forming an etching stop layer on a sidewall of the stack structure, wherein an energy gap of the etching stop layer is larger than 6 eV, and a material of the etching stop layer comprises aluminum oxide, magnesium oxide, silicon zirconium oxide, silicon hafnium oxide, or combinations thereof; and
    forming a plurality of conductive structures, wherein at least one conductive structure of the plurality of conductive structures is electrically connected to at least one of the conductive layers, the etching stop layer has a vertical segment and a horizontal segment connected to each other, the vertical segment is located on the sidewall of the stack structure, and the at least one conductive structure is in direct contact with the vertical segment of the etching stop layer.

11. The manufacturing method of the semiconductor structure according to claim 10, wherein the etching stop layer is formed between the at least one conductive structure and the sidewall.

12. The manufacturing method of the semiconductor structure according to claim 10, wherein each of the conductive structures is respectively electrically connected to each of the conductive layers.

13. The manufacturing method of the semiconductor structure according to claim 10, wherein the at least one conductive structure penetrates through the horizontal segment to be electrically connected to the at least one of the conductive layers.

14. The manufacturing method of the semiconductor structure according to claim 10, wherein forming the etching stop layer comprises:
 forming a first stop layer on the sidewall of the stack structure, wherein an energy gap of the first stop layer is larger than 6 eV; and
 forming a second stop layer on the first stop layer.

15. The manufacturing method of the semiconductor structure according to claim 14, wherein the first stop layer is formed between the second stop layer and the sidewall of the stack structure.

16. The manufacturing method of the semiconductor structure according to claim 14, wherein the at least one conductive structure is adjacent to the second stop layer.

17. The manufacturing method of the semiconductor structure according to claim 14, wherein a material of the first stop layer comprises silicon oxide, aluminum oxide, magnesium oxide, silicon zirconium oxide, silicon hafnium oxide, or combinations thereof, a material of the second stop layer comprises silicon nitride, aluminum oxide, magnesium oxide, silicon zirconium oxide, silicon hafnium oxide, or combinations thereof, and the first stop layer is different from the second stop layer.

18. The manufacturing method of the semiconductor structure according to claim 10, further comprising:
 forming a dielectric layer on the etching stop layer.

* * * * *